United States Patent [19]

Early

[11] Patent Number: 4,583,111

[45] Date of Patent: Apr. 15, 1986

[54] INTEGRATED CIRCUIT CHIP WIRING ARRANGEMENT PROVIDING REDUCED CIRCUIT INDUCTANCE AND CONTROLLED VOLTAGE GRADIENTS

[75] Inventor: James M. Early, Palo Alto, Calif.

[73] Assignee: Fairchild Semiconductor Corporation, Cupertino, Calif.

[21] Appl. No.: 530,636

[22] Filed: Sep. 9, 1983

[51] Int. Cl.$^4$ ............................................. H01L 23/48
[52] U.S. Cl. ...................................... 357/68; 357/45; 357/40; 307/303; 333/246
[58] Field of Search ...................... 357/70, 40, 45, 68, 357/71, 68, 40, 45; 307/303, 443; 333/246

[56] References Cited

U.S. PATENT DOCUMENTS

| | | | |
|---|---|---|---|
| 3,365,707 | 1/1968 | Mayhew | 357/68 |
| 3,808,475 | 4/1974 | Buelow | 357/68 |
| 4,021,838 | 5/1977 | Warwick | 357/70 |
| 4,255,672 | 3/1981 | Ohno et al. | 357/40 |
| 4,475,119 | 10/1984 | Kuo et al. | 357/68 |
| 4,499,484 | 2/1985 | Tanizawa | 357/68 |
| 4,511,914 | 4/1985 | Remedi | 357/68 |

OTHER PUBLICATIONS

Journal of Digital Systems, vol. 6, No. 1, 1982, Maryland, US; Syed et al, "Single Layer Routing of Power and Ground Networks in Integrated Circuits", pp. 53–63.

*Primary Examiner*—Andrew J. James
*Assistant Examiner*—Mark Prenty
*Attorney, Agent, or Firm*—Burns, Doane, Swecker & Mathis

[57] ABSTRACT

The area circumscribed by the current path on an integrated circuit chip is diminished, to thereby reduce the inductance of the chip and the likelihood of inductively generated errors, by disposing the bonding pads, through which the current source and current sink are respectively connected to logic gates, physically adjacent to one another. A further reduction in the area of the current loop is obtained by locating power and ground busses adjacent to one another relative to the logic gates. These two busses can be superposed one over the other on different metallic layers of the chip, so that the space between them is only the thickness of the isolation layer which separates the two metallic layers. The distribution of voltage to the logic gates is made uniform by varying the widths of the busses along their lengths in accordance with the currents they carry, and by ensuring that the total length of the current path for the gates is the same for every gate.

25 Claims, 9 Drawing Figures

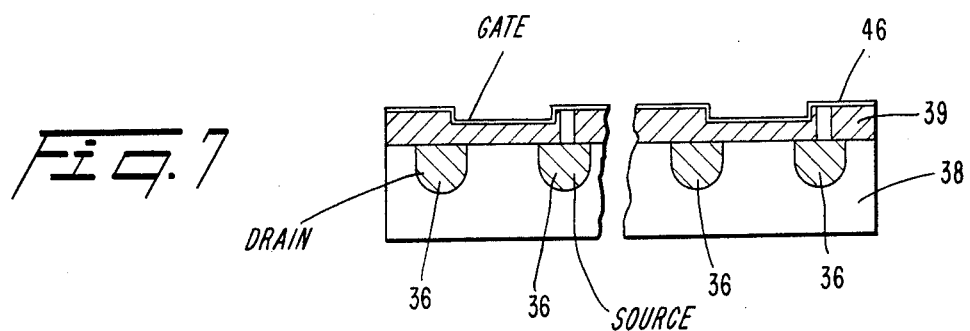
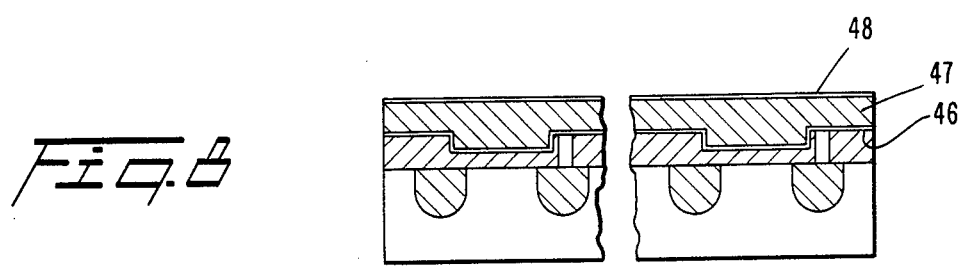
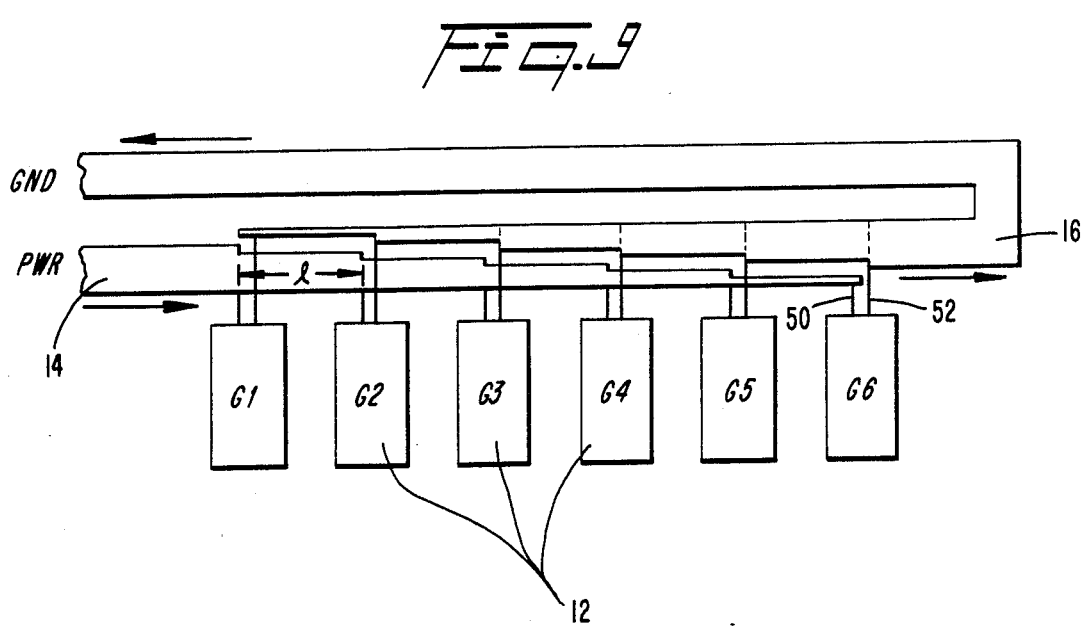

INTEGRATED CIRCUIT CHIP WIRING ARRANGEMENT PROVIDING REDUCED CIRCUIT INDUCTANCE AND CONTROLLED VOLTAGE GRADIENTS

BACKGROUND OF THE INVENTION

The present invention is directed to large scale integrated circuit chips, and more particularly to wiring arrangements for such chips that reduce inductive crosstalk which might lead to signalling errors on the chip and provide for more uniform voltage distribution to the gates on the chip.

With the continuing advances in the areas of microelectronics and integrated circuit technology, the operating speed, size and circuit density of large scale integrated (LSI) and very large scale integrated (VLSI) logic chips are increasing all the time. Up to now, one phenomenon that has been given little or no consideration in the design of these chips, since it has posed no significant problems, has been the magnetic fields that are generated by current path loops on the chip. In smaller chips, e.g., those with less than 100 gates, these fields are so weak that they do not have a noticeable effect on signalling currents. However, as the speed and density of the circuits on the chip continue to be increased, this phenomenon becomes increasingly more important.

In a conventionally wired chip, the current is usually injected on to the chip through a bonding pad located at one corner of the chip or on one side thereof, and another bonding pad located at the diagonally opposite corner, or the opposite side of the chip, is connected to a ground reference potential to sink the current from the gates. Consequently, a current path is established from one corner or side of the chip to the opposite corner or side of the chip, which then loops around back to the pad through which the current is injected to encompass a substantial portion of the area of the chip. For example, referring to FIG. 1, an integrated circuit chip 10 can comprise a multiplicity of logic gates 12 which are each connected in parallel with one another between a power bus 14 and a ground bus 16. As depicted in FIG. 1, the logic gates 12 are divided into two rows and the power and ground busses are also divided into two parallel conductive runs, that are respectively connected to the two rows. However, it will be appreciated that the chip might have only one row of logic gates or a multiplicity of rows each being supplied by a separate conductive run. The particular number of rows of parallel connected logic gates will be determined by the circuit to be incorporated in the chip and the design layout principles that are utilized.

The chip of FIG. 1 embodies a conventional wiring arrangement for supplying current to, and sinking it from, the individual logic gates. More particularly, the power supply bus 14 is connected to a bonding pad 18 that is disposed at one corner of the chip. This pad is in turn connected to one of the pins in the chip package which is supplied with current from a suitable supply source. The ground bus 16 is similarly connected to a bonding pad 20 located on the diagonally opposite corner of the chip from the pad 18. The pad 20 is connected to a suitable ground reference potential through a connecting pin on the chip package.

In a slightly different wiring scheme, the current supply pad 18 can be located closer to the center of the top edge of the chip, and the current sinking pad can be located closer to the center of the bottom edge of the chip, rather than the pads being disposed on diagonally opposite corners.

In operation, the current flows from the bonding pad 18 through the various logic gates which are in a conductive state to the ground bus 16 and the bonding pad 20. The return path for the current is from the bonding pad 20 back to the pad 18 which are separated by at least the length of the diagonal dimension of the chip package. This current flow path is schematically indicated by the dashed lines in FIG. 1 for the case when one of the gates in the upper row of logic gates is conducting. Each gate which is at a conductive state will also establish a similar flow path. In actual practice, this return path is formed by the conductive runs on a printed circuit board (not shown) on which the chip is mounted. These runs lead from the connecting pins associated with the bonding pads 18 and 20 to edge connectors on the board which are hooked up to the power supply.

As can be seen, the area that is encompassed by the current loop comprises, at a minimum, a substantial portion of the area of the integrated circuit chip. During a clock cycle, the change in switching states of the logic gates on the chip might be substantial enough to cause a significant change in the amount of current flowing from the pad 18 to the pad 20, and the current induced in other on-chip conductors by the changing magnetic field could be substantial enough to generate logic errors. More particularly, during a clock cycle a number of gates can successively change states. A switching which occurs in a later stage of the series of gates can inductively trigger a change in state in an earlier stage during the same clock cycle, thus generating a logic error.

The possibility of such an occurrence increases with increased packing density of chips. For example, on a VSLI chip having $10^6$ gates, during a given clock cycle the number of gates switching in one direction might exceed the number of gates switching in the other direction by as much as 20,000. If it is assumed that the total current supplied to the chip is 25 amperes, such that each individual logic gate receives 25 microamps, a net change in state of 20,000 gates will result in the current flowing through the chip being increased or decreased by $\frac{1}{2}$ ampere. Such a change, and more particularly, the electromotive force generated by such a change, can be significant when considering the relatively low voltage levels that are typically used in IC chips. For example, the difference between a logic high and a logic low state might be as low as 0.1 volt. If a magnetic field that is inductively generated by a current change is large enough, it may be possible to affect the voltage on the signal lines within the chip such that one logic state is improperly detected as being the other state, resulting in a logic error.

Since the total magnetic flux produced by the current loop is a product of the inductance and the current, it will be appreciated that if the inductance of the chip can be reduced the probability of logic errors that are caused by inductively generated magnetic fields will also be diminished.

The inductance L generated by a current loop can be defined as follows:

$$L = \frac{\mu_o A}{2\pi R},$$

where:

$\mu_o$ is the effective permeability of the region on the chip in which the associated magnetic field is present, A is the area circumscribed by the current loop, and R is the mean radius of the loop.

As can be seen, the magnitude of the inductance is directly related to the area of the current loop. More appropriately, it is proportional to the mean radius of the loop (since $A = \pi R^2$). If the area within the current loop can be reduced, the probability of inductive interference between circuits can also be reduced, since the magnetic field intensity is directly proportional to the inductance for a given current level.

OBJECTS AND STATEMENT OF THE INVENTION

It is accordingly a general object of the present invention to reduce the likelihood of crosstalk created by inductive interference of the circuits on a chip.

It is a more specific object of the present invention to reduce the inductance of circuits on an integrated circuit chip by providing a novel wiring arrangement which decreases the area on the chip that is encompassed by current loops, relative to prior practices.

It is a further object of the present invention to provide a uniform distribution of voltage to the individual gates on a chip so that each gate receives the same amount of current.

In accordance with one aspect of the present invention, the area circumscribed by the current path on the chip is reduced by changing the conventional location of the bonding pads through which the current source and current sink are respectively connected to the logic gates. These pads are disposed physically adjacent to one another in accordance with the invention, rather than on opposite sides of the chip, for example. A further reduction in the area of the current loop is obtained by locating power and ground busses adjacent to one another relative to the logic gates. Ideally, these two busses can be superposed one over the other on different metallic layers of the chip, so that the space between them is only the thickness of the isolation layer which separates the two metallic layers.

In another aspect of the invention, the voltage gradient across the gates on the chip is regulated to be the same for each gate by ensuring that the total length of the current path is the same for current flowing through each gate, and by varying the cross-sectional area of the power and ground busses in accordance with the magnitude of the current carried in each portion of the conductors.

Further features and advantages of the present invention are set forth in the following detailed description of various embodiments of the invention illustrated in the accompanying drawings.

BRIEF DESCRIPTION OF THE DRAWINGS

FIG. 7 is a cross-sectional side view of the IC chip illustrated in FIG. 5, taken along the section line 7—7;

FIG. 8 is a sectional side view of an alternative embodiment of the construction of the chip illustrated in FIG. 5; and FIG. 9 is a diagram of a wiring arrangement showing design considerations for controlling the voltage gradient across the gates.

DESCRIPTION OF THE PREFERRED EMBODIMENTS

Figure 1:
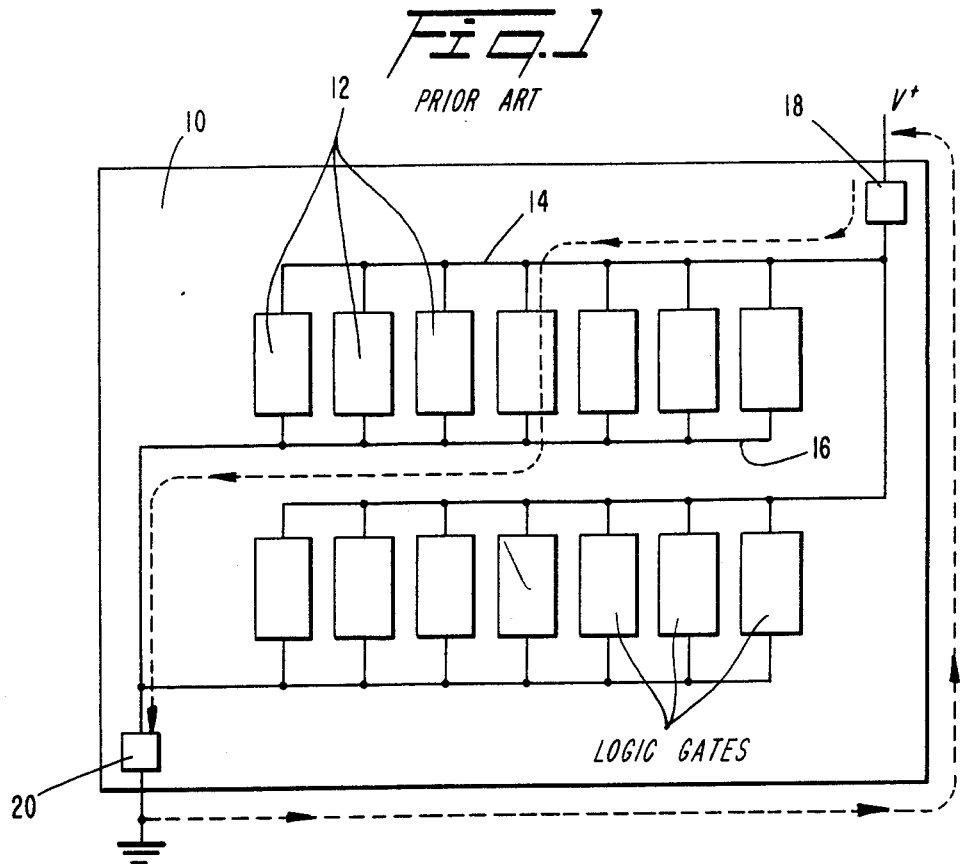
FIG. 1 is a schematic and block diagram of a prior art wiring arrangement for an integrated circuit chip.
Figure 2:
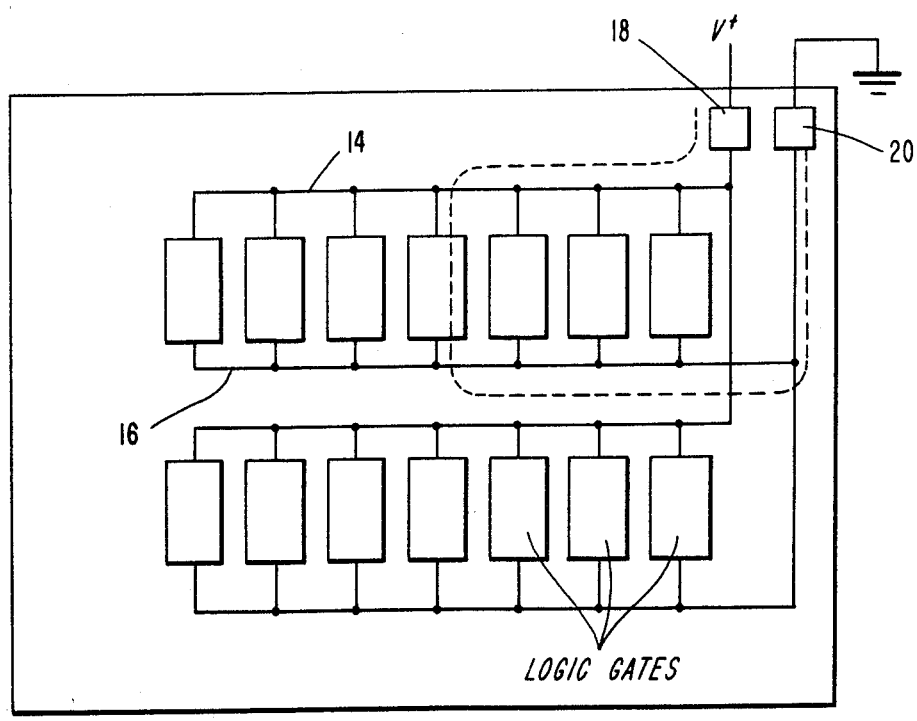
FIG. 2 is a schematic and block diagram illustrating a first embodiment of a wiring arrangement for an integrated circuit chip incorporating the present invention.

As indicated previously, one facet of the present invention is concerned with alleviating the potentially error-producing noise that can be inductively generated during a switching cycle that produces a net change in current flow on the integrated circuit chip. In accordance with the present invention, a reduction of the area of the current loop on the chip is accomplished, in one aspect of the invention, by bringing the location of the current sinking pad 20 closer to that of the current supply pad 18 on the chip. An implementation of this principle is illustrated in FIG. 2. As can be seen therefrom, the wiring topology of the chip is generally similar to that illustrated in FIG. 1 except for the physical location of the bonding pad 20. In this instance, it is located physically adjacent to pad 18. In other words, the effect of the change is to bring the source and sinking current paths closer together to thereby reduce the area between them. With such a change from conventional practice, the area on the chip that is encompassed by the current loop is substantially reduced, as shown by the dashed line.

As used in the context of the present invention, the term "physically adjacent" does not necessarily imply that the bonding pads 18 and 20 are two pads which are next to each other on the chip. Rather, it is interpreted in a somewhat broader sense to refer to the location of the two pads relative to the logic gates. Thus, although the most preferred implementation of this aspect of the invention is to have the current supply and current sinking pads be successive pads on the same side of the chip, in practice certain design limitations may require that the source and ground pins be separated by at least one other pin. Under such circumstances the present invention would provide that the bonding pads be located as close as practically possible to one another and on the same side of the chip relative to the placement of the logic gates, even though they are not next to one another.

Figure 3:
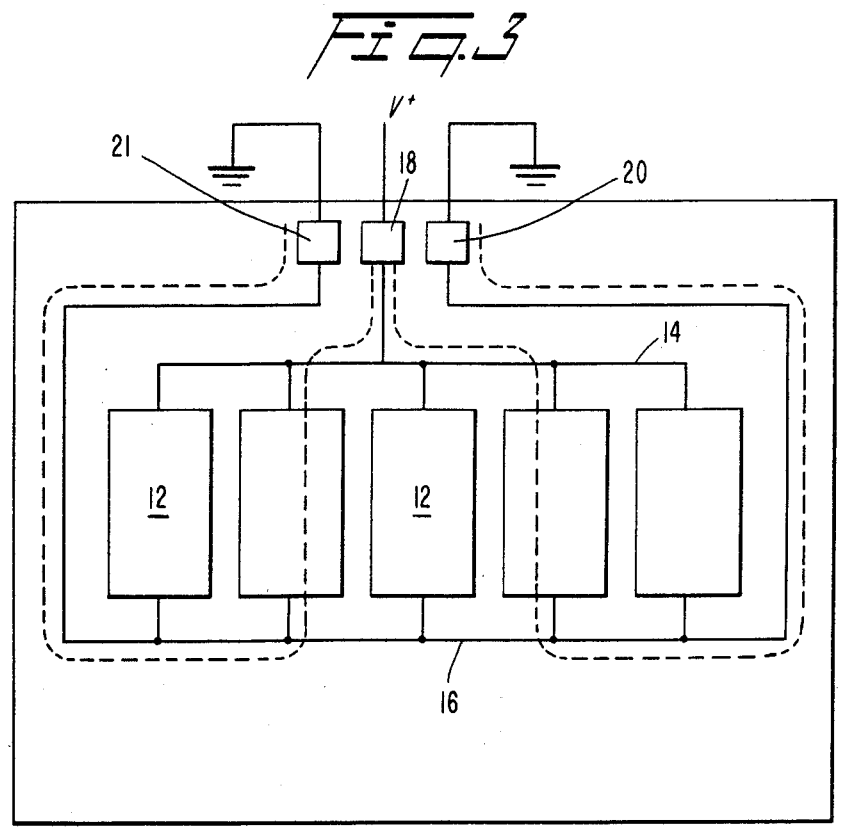
FIG. 3 is a schematic and block diagram of a modification of the wiring arrangement illustrated in FIG. 2.

A modification of this first feature of the invention is illustrated in FIG. 3. In this modification, the bonding pad 18 for the power source is disposed at approximately the middle of one edge of the chip. The ground bus 16 is connected at opposite ends thereof to two bonding pads 20 and 21. These pads are respectively disposed on opposite sides of the power source pad 18. The advantage of this layout is that it balances the current flow paths on the chip. In other words, the magnetic field generated as a result of the flow of current in one of the paths illustrated by the dashed lines will diminish the effect of the magnetic field generated by the flow of current in the other illustrated path, since current flows in opposite directions in the two loops.

Alternatively, the ground bus 16 could be connected to a single pad and the power bus connected to two pads respectively disposed on opposite sides of the grounded pad, to achieve the same effect.

Figure 4:
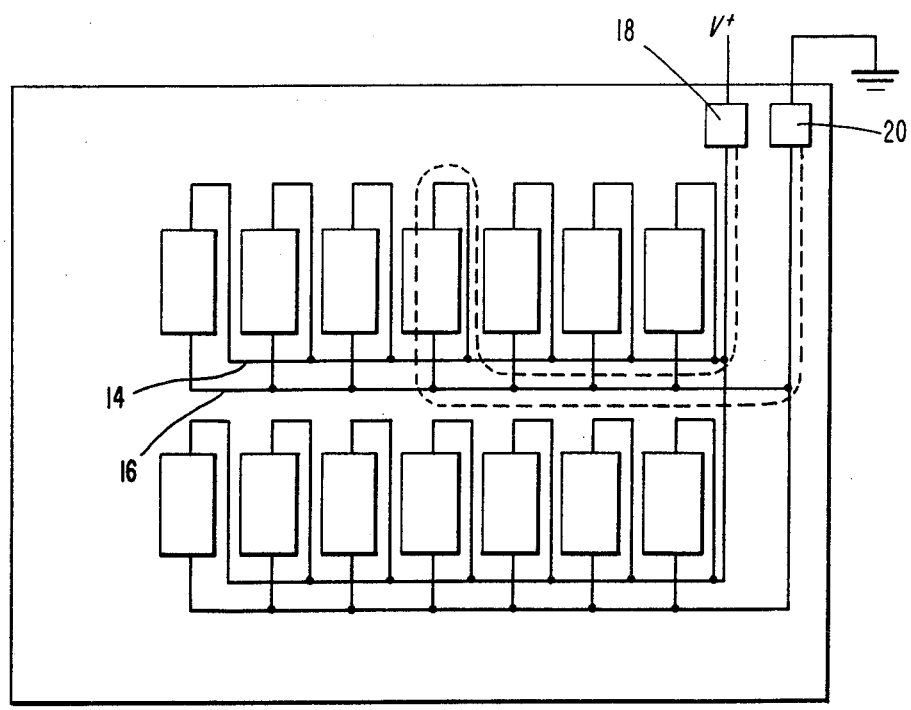
FIG. 4 is a second embodiment of a wiring arrangement according to the present invention.

In the embodiment of FIGS. 2 and 3, the power and ground busses 14 and 16 are respectively located on opposite sides of the logic gates. This separation by the width of the gates results in a spacing between the supply and sink busses that accounts for a substantial portion of the reduced area encompassed by the current loop. While the embodiment of FIGS. 2 and 3 offers a significant decrease in current loop area over the conventional practice depicted in FIG. 1, additional modifications can be made to further decrease the inductance of the circuit. An embodiment which accomplishes this latter objective is illustrated in FIG. 4. In this embodiment, further modification from conventional practice resides in the placement of both current busses on the same side of the logic gates, so that they run adjacent to one another. With this embodiment, it can be seen that the area encompassed by the individual current loops is further decreased. Thus, the inductance of the circuit is likewise reduced, and is therefore less likely to result in the generation of logic errors.

In the most preferred implementation of the previously described aspects of the present invention, the area encompassed by the current loops is at a minimum. However, it will be appreciated that when all other design factors are considered, minimization of the current loop area may not be possible without adversely affecting other parameters. Thus, a practical implementation of the inventive concept is to reduce the area of the current loop to the extent possible without seriously compromising other design considerations.

Figure 5:
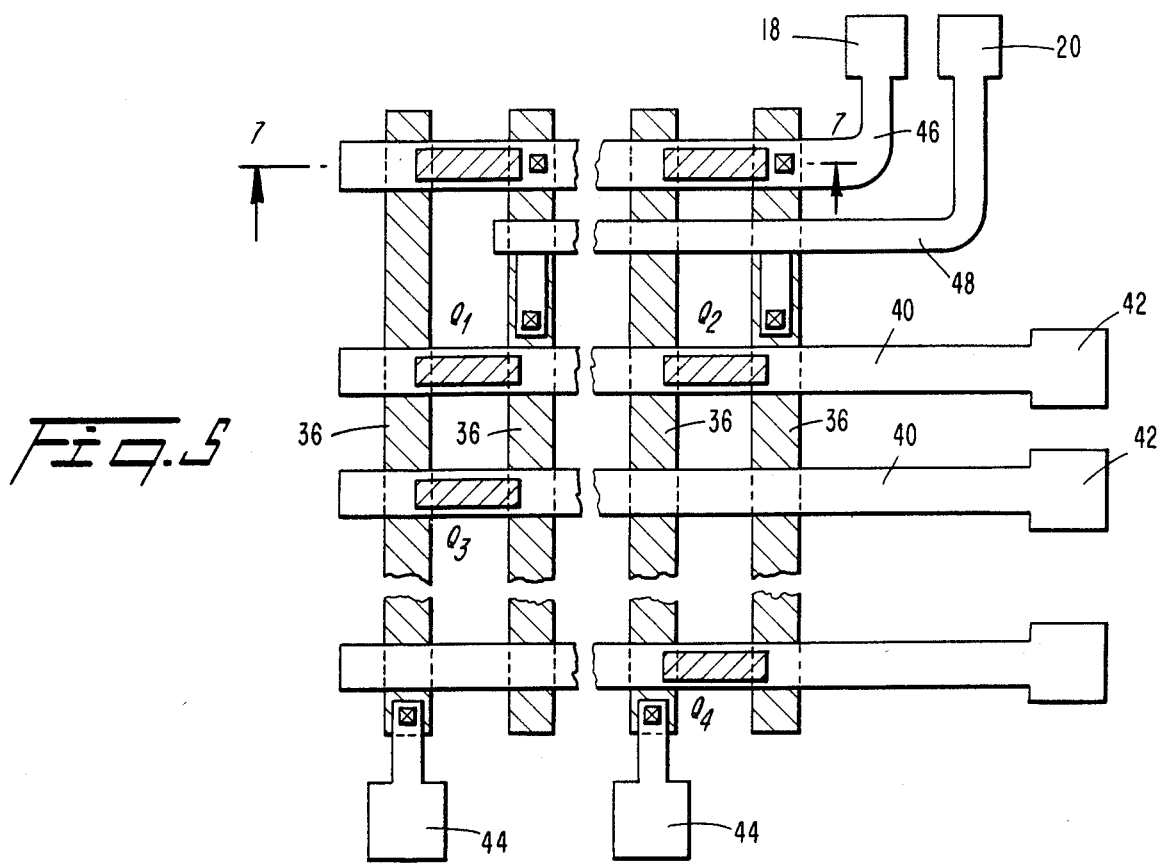
FIG. 5 is a top view of a portion of an integrated circuit (IC) chip implementing some of the principles of the present invention.

A more detailed illustration of an integrated circuit chip implementing some of the principles of the invention is illustrated in FIG. 5. The circuit incorporated in the chip of FIG. 5 is an MOS memory circuit, e.g., a ROM, such as that schematically illustrated in FIG. 6. The MOS memory circuit is used here to illustrate the invention because it lends itself to a relatively simple and straightforward explanation. However, it will be appreciated by those having familiarity with integrated circuit technology that the invention is not so limited, but rather is applicable to practically any type of circuit, not just memories, and other types of integration techniques, e.g., bipolar, I²L, etc. In fact, a particularly appropriate application of the present invention may be in the area of high-speed bipolar logic gate chips, since these types of gates are more susceptible to voltage transients than those of other technologies.

Figure 6:
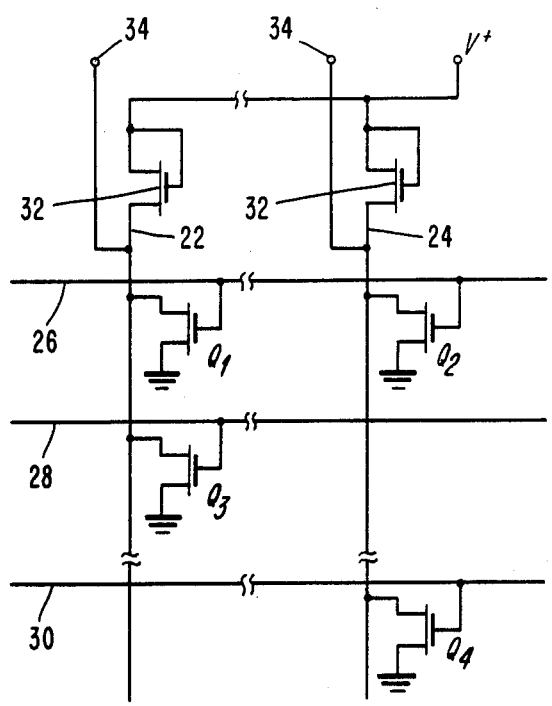
FIG. 6 is an equivalent schematic electrical diagram of the circuit illustrated in FIG. 5.

Referring to FIG. 6, the memory circuit comprises bit lines 22 and 24, and word lines 26, 28 and 30. Each bit line is connected to the power supply through a load FET 32. Each line is also connected to a data output, or read, terminal 34. The memory elements whose location and connection determine the information stored in the chip are comprised of FETs Q1-Q4 having their gates connected to the respective word lines 26-30, their drain terminals connected to the bit lines 22 and 24, and their source terminals connected in common to the ground reference potential.

In operation, the binary signals impressed on the word lines 26-30 comprise an input address, and the output data is read on the bit line terminals 34. More specifically, if it is assumed that a binary one is represented by a high voltage level, e.g., 5.0 volt, and a binary zero is represented by a low voltage level, e.g., 0-0.1 volt, each word line on which a binary one appears will cause the memory FETs whose gates are connected to that line to become conductive. This action in turn causes the bit lines connected to the drain terminals of those FETs to be grounded, thereby representing binary zeros at their respective output terminals. Conversely, when a word line is at the binary zero state, the memory FETs connected to that line will be off, and if all memory FETs connected to a bit line are off that line will be in a high state. In essence, all of the memory FETs connected to a bit line together form a NOR gate in which the word lines are input terminals and the bit line is an output terminal.

Thus in general it will be observed that when most of the address bits are binary zeros, the current through the chip will be relatively low because most of the memory FETs will be off. On the other hand, if most of the address bits are binary ones, the current flow will be much higher. If, on any given clock cycle the 0:1 bit ratio in the address word changes significantly, a substantial change in net current flow through the chip will occur if it results in a significantly greater number of memory FET's being switched in one direction than those switched in the other direction. If the inductance of the circuit is large enough, the electromotive force generated by the current change could affect the signals appearing on the word lines 26-30 and possibly produce errors in the output data.

Of course, this general observation will be subject to variation dependent upon the distribution of the memory FETs relative to the word lines, which is dependent upon the particular information stored in the ROM.

Referring now to FIG. 5, the drain and source elements of the various FETs are formed by diffusion tracks 36 in a substrate 38. For example, the diffusion tracks might be of N-type of material and the substrate can comprise a P-type material. These diffusion tracks are parallel to one another and run substantially along the length of the chip, except for a break in every other track which is used to form the load FETs. A layer 39 of a suitable insulator, such as silicon dioxide, is deposited over the substrate and diffused tracks, and then appropriately etched in accordance with well known techniques to reduce their thickness in areas overlapping two adjacent diffusion tracks and thereby provide the gates of the FETs. The silicon dioxide layer is then overlaid with parallel rows of conductive runs 40 which comprise the word lines of the circuit. Those portions of the silicon dioxide layer which have a reduced thickness and which are overlaid by these conductive runs determine where the memory FETs are located in the circuit, and thus the information stored therein. Each word line is connected to a suitable bonding pad 42 disposed adjacent one edge of the chip.

Every other diffusion track 36, i.e., each unbroken one, forms a bit line of the circuit. These tracks are appropriately connected to bonding pads 44 disposed on the bottom edge of the chip so that the stored logic data can be read therefrom.

In addition to the conductive runs 40 that form the word lines, two additional runs 46 and 48 are disposed on the chip and respectively provide the power bus and ground bus. Conventionally, the ground bus, which is connected to the other diffusion tracks of the circuit, i.e., those which do not form the bit lines, might be located at the bottom of the chip as viewed in FIG. 5. However, in accordance with the present invention, it is disposed adjacent the power bus 46. This latter bus is connected to the short broken sections of the alternate diffusion tracks, which comprise the drain terminals of the load FETs, as well as to the gates of these FETs. A cross-sectional side view of the chip, taken through the length of the power bus 46, is illustrated in FIG. 7.

While the embodiments of FIGS. 4 and 5 help to substantially diminish the area of the current loops that are established on the chip, the best case approach is to overlay the power and ground busses so that there is no space between them in the plane of the chip. This modification can be easily accomplished when two layer or multi-layer metallization is utilized during chip fabrication. One example of such a modification is illustrated in FIG. 8, wherein the power bus 46 is overlaid with a second layer of silicon dioxide 47 or other suitable insulating material, and this insulation layer is then overlaid with the conductive run forming the ground bus 48. While the embodiment of FIG. 8 shows the ground and power busses to be disposed in adjacent metal layers, separated only by the thickness of the intervening insulation layer 47, it will be appreciated by those of ordinary skill in the art that the two layers need not be adjacent metal layers, but rather that the ground and power busses can be disposed in metal layers that are located almost anywhere within the thickness of the chip.

The underlying principle of the foregoing facet of the invention, i.e. to reduce the area of current loops on a chip to thereby decrease circuit inductance, in comparison with conventional practices, and diminish the probability of inductively generated digital errors, is applicable to any type of integrated circuit technology and is limited only by the particular design criteria for that technology and for the specific circuit incorporated in the chip. For example, a particular technology may require minimum space in between the power and ground busses, and certain designs may require the busses to be spaced so that signal lines can be appropriately accommodated. However, within such limitations it will still be practical to employ the disclosed concepts.

In accordance with another feature of the present invention, the voltage gradient in the power and ground busses is controlled so that the same amount of current flows through each of the logic gates, or stages. Since the resistance to flow of a current is proportional to the length of a conductor through which the current must flow, it will be appreciated that a voltage gradient will be established along each of the power and ground busses. If this voltage gradient is not controlled or otherwise accounted for in the design of the chip, it is possible that different magnitudes of current will flow through the various logic gates connected along the lengths of the power and ground busses. In some circumstances, a current differential between gates could lead to logic errors or other failures. For example, in integrated injection logic the current in a grounded emitter switching transistor or in a grounded base current injector transistor can be exponentially proportional to the voltage difference between the power and ground busses. Thus, it is desirable to have the same voltage difference between these two busses for each logic gate connected thereto, so that all gates will operate with the same amount of current.

In furtherance of this objective, two basic principles are employed in the design of the power and ground busses. First, the direction of current flow is the same in both busses at their points of connection to the gates. With this approach, the combined lengths of the power and ground busses through which the current must flow is the same for every gate. Referring to FIG. 9, the direction of current flow in the power bus 14 is from left to right as viewed in the Figure. Similarly, the current flows in the same direction in that portion of the ground bus 16 which is connected to the gates 12.

Thus referring to the extreme left- and right-hand gates G1 and G6 shown in the Figure, the current path in the power bus 16 for current supplied to the right-hand gate G6 exceeds that for the left-hand gate G1 by five unit lengths, with a unit conductor length l in this case being equal to the distance between the connections of two adjacent gates to the power bus. However, in the ground bus, the current path for current from the right-hand gate G6 is shorter than that for the left-hand gate G1 by the same five unit lengths. The same relationship holds true for all other pairs of gates. Thus, the total current path from the power bonding pad to the ground bonding pad is the same for all gates connected to the power and ground busses.

In order to enable the power and ground bonding pads to be located physically adjacent one another in accordance with the previously recited features of the invention, the ground bus 16 is looped back on itself after the last connection in the direction of current flow. Although this return portion of the ground conductor is illustrated in FIG. 9 as being located in the same layer of the chip as the gates, it will be appreciated that it can overlay the connection portion of the ground bus in a separate layer, as illustrated with respect to FIG. 8.

The second design principle that is employed to control the voltage gradient relates to the cross-sectional area of the busses. More particularly, the cross-sectional area of each unit length is proportional to the amount of current carried by that unit length. Referring again to FIG. 9, the width of each of the power and ground busses is stepped so that each conductor is widest where the magnitude of current is greatest and narrowest where the current is smallest. With this arrangement, the current density in each conductor is constant throughout the length of the conductor. Therefore, the voltage drop along each unit length of the conductors will be the same, so that the voltage gradient from gate to gate is uniform.

Typically, the height of each conductor will remain the same throughout the entirety of its length, due to the metallization process that is employed to deposit the metal layer on the substrate. Therefore, the control of the cross-sectional area of the conductor is obtained by regulating its width. In other words, the width of each unit length of the conductors is proportional to the current carried in that portion of the conductor.

As illustrated in FIG. 9, the variation in the width of each conductor is provided by means of discrete steps located along the length of the conductor. Although it is alternatively possible to employ a uniform taper along the length of the conductor, the discrete step approach is preferred because it lends itself more readily to computer-aided design (CAD) of integrated circuit chips. Furthermore, the changes in current magnitude within the conductor occur at discrete points, i.e. the points where the gates are connected, rather than continuously. Thus, it is most logical to locate the changes in width of the conductor commensurate with the increments of load along the busses.

Since the current flows in the same direction in both the power and ground busses at their points of connection to the gates, the width changes of these two busses are complementary to one another. Consequently, it is possible to "nest" the two conductors with one another, achieving a savings in space on the surface of the chip. More particularly, the total width of the area occupied by the two busses along the portion of their lengths which is connected to the gates comprises the width of one of the busses at its widest point, the distance of the spacing between the conductors, and the width of the other conductor at its narrowest point. In contrast, two busses of constant width would occupy an area having a width equal to their total width plus the space between them.

The control of the voltage gradient across the gates has been described thus far with respect to the power and ground busses. It will be appreciated that the foregoing principles should be applied to all conductors which carry current to or from the gates. For example, FIG. 9 illustrates that the current is conducted between each gate 12 and the busses 14 and 16 by means of a second set of conductors 50 and 52. The total length of the current path along these conductors should also be the same for each gate. To this end, the conductor 50 to the power bus 14 is connected to this bus along its edge that is closest to the gates, since that edge is the same distance from each gate. Conversely, the conductor 52 to the ground bus 16 is connected to the edge of bus that is farthest from the gates, since this edge is also a constant distance from each gate. Thus, each pair of conductors 50 and 52 has the same length for all gates.

It is not necessary that the conductors 50 and 52 be connected to the edges of the busses, or that all conductors connected between one of the busses and the various gates have the same length. Rather, the criterion that is controlling is that the total current path from the power source to the ground reference be the same for each gate.

It will be appreciated by those of ordinary skill in the art that the present invention can be embodied in specific forms other than those explicitly disclosed herein without departing from the spirit or essential characteristics thereof. The presently disclosed embodiments are considered in all respects to be illustrative and not restrictive. The scope of the invention is indicated by the appended claims rather than the foregoing description, and all changes that come within the meaning and range of equivalents thereof are intended to be embraced therein.

What is claimed is:

1. In an integrated circuit chip having a multiplicity of logic gates connected in parallel with one another between a power bus from which current is supplied to said gates and a ground bus which sinks current form said gates, a wiring arrangement for diminishing the likelihood of inductive crosstalk between circuits on the chip comprising a first bonding pad located on the chip and connected to said power bus for enabling a source of power to be connected to said power bus, and a second bonding pad located physically adjacent said first pad on said chip and connected to said ground bus, and wherein one of said busses extends parallel to and overlies the other bus on different respective layers of the chip.

2. The wiring arrangement of claim 1 wherein two pads are connected to one of said busses, and the pad connected to the other bus is disposed between said two pads connected to said one bus.

3. In an integrated circuit chip having a multiplicity of logic gates connected in parallel with one another between a power bus from which current is supplied to said gates and a ground bus which sinks current from said gates, a wiring arrangement for diminishing the likelihood of inductive crosstalk between circuits on the chip comprising a first bonding pad located on the chip and connected to said power bus for enabling a source of power to be connected to said power bus, and a second bonding pad located physically adjacent said first pad on said chip and connected to said ground bus, and wherein said power and ground busses each have a cross-sectional area which varies along its length in accordance with the magnitude of current carried in said bus and the current flowing in each of said busses flows in the same direction in at least those portions of the busses which have a varying cross-sectional area.

4. The wiring arrangement of claim 3 wherein said busses have stepped widths.

5. In an integrated circuit chip having a multiplicity of logic gates connected in parallel with one another between a power bus from which current is supplied to said gates and a ground bus which sinks current from said gates, a method for diminishing the likelihood of inductive crosstalk between circuits, comprising the steps of reducing the on-chip area circumscribed by the paths of current flowing from said power bus through said gates and to said ground bus by injecting current onto said power bus at a location that is disposed physically adjacent the location of a bonding pad for said ground bus, and maintaining the total length of the path of current flowing through said gates the same for each gate.

6. The method of claim 5 wherein the current flows in the same direction in each of said power and ground busses at least along the portion of the lengths of each bus that is connected to said gates.

7. In an integrated circuit chip having a multiplicity of logic gates connected in parallel with one another between a power bus from which current is supplied to said gates and a ground bus which sinks current from said gates, a wiring arrangement in which said power bus and said ground bus extend in the same direction and one of said busses overlies the other on different respective layers of the chip so that the area of current loops on said chip are reduced and said busses each have a cross-sectional area which varies along its length in accordance with the magnitude of the current carried therein.

8. The wiring arrangement of claim 7 wherein said busses have stepped widths.

9. The wiring arrangement of claim 7 wherein said busses are oriented so that the current flowing in each of said power and ground busses flows in the same direction in at least those portions of the busses which have a varying cross-sectional area.

10. In an integrated circuit chip having a multiplicity of logic gates connected in parallel between a power source and a ground reference potential by means of a power bus and a ground bus, respectively, a method for providing the same voltage gradient across each gate connected to said busses, comprising the steps of:

maintaining the total length of the current path from the power source to the ground reference potential the same for each gate; and varying the cross-sectional areas of said busses in accordance with the magnitude of current which they conduct.

11. The method of claim 10 wherein the current flows in the same direction in each of said power and ground busses at least along the portion of the lengths of each bus that is connected to said gates.

12. An integrated circuit comprising:
a multiplicity of logic gates that are electrically in parallel with one another;
a power bus connecting each of said gates to a power source, said power bus having a cross-sectional area which varies along its length in accordance with the magnitude of current conducted thereby; and
a ground bus connecting each of said gates to a ground reference potential, said ground bus having a cross-sectional area which varies along its length in accordance with the magnitude of current conducted thereby and being oriented so that current flows in the same direction in at least those portions of each of the power and ground busses which have a varying cross-sectional area.

13. The integrated circuit of claim 12 wherein each of said busses have stepped widths.

14. The integrated circuit chip of claim 1 wherein said first and second bonding pads are successive pads on the same side of the chip.

15. The integrated circuit chip of claim 3 wherein said first and second bonding pads are successive pads on the same side of the chip.

16. In an integrated circuit chip in which plural gates are connected in parallel to a power supply network, a wiring arrangement for reducing circuit inductance and voltage gradients on the chip, comprising:
a first bus extending from a first bonding pad located at one edge of the chip and disposed adjacent said gates, at least a portion of said first bus lying adjacent said gates having a width which decreases with increasing distance from said bonding pad in accordance with the magnitude of the current conducted in the bus;
a second bus having a first portion disposed adjacent said portion of said first bus, said first portion having a width which increases with increasing distance from said one edge in a manner complementary to the width of said portion of said first bus and in accordance with the magnitude of current conducted in said second bus, said second bus having a second portion which connects an end of said first portion that is remote from said edge with a second bonding pad located at said one edge adjacent said first bonding pad; and
means for connecting said gates in parallel to each of said first and second busses.

17. The wiring arrangement of claim 16 wherein said second portion of said second bus is disposed on a different layer of said chip than said first bus and said first portion of said second bus, and overlies said first bus and said first portion of said second bus.

18. The wiring arrangement of claim 16 wherein said portion of said first bus and said first portion of said second bus have stepped widths and said connecting means comprise conductors that respectively connect each gate to the busses at a location adjacent each step in the width of the bus.

19. The wiring arrangement of claim 18 wherein all of the conductors connecting the gates to the first bus have the same length and all of the conductors connecting the gates to the second bus have the same length.

20. The wiring arrangement of claim 18 wherein the total length of the pair of conductors which respectively connect a gate to said first and second busses is the same for each gate.

21. The wiring arrangement of claim 16 wherein said first and second bonding pads are successive pads along said one edge of the chip.

22. In an integrated circuit chip in which plural gates are connected in parallel to a power supply network, a wiring arrangement for reducing circuit inductance and voltage gradients on the chip, comprising:
a first bus which extends from a bonding pad and which is disposed adjacent said gates, at least a portion of said first bus lying adjacent said gates having a width which decreases with increasing distance from said bonding pad in accordance with the magnitude of the current conducted in the bus;
a second bus having a portion disposed parallel to and adjacent said portion of said first bus, said portion of said second bus having a width which increases in a manner complementary to the width of said portion of said first bus and in accordance with the magnitude of current conducted in said second bus; and
means for connecting said gates in parallel to each of said first and second busses.

23. The wiring arrangement of claim 22 wherein said portion of said first bus and said first portion of said second bus have stepped widths and said connecting means comprise conductors that respectively connect each gate to the busses at a location adjacent each step in the width of the bus.

24. The wiring arrangement of claim 23 wherein all of the conductors connecting the gates to the first bus have the same length and all of the conductors connecting the gates to the second bus have the same length.

25. The wiring arrangement of claim 23 wherein the total length of the pair of conductors which respectively connect a gate to said first and second busses is the same for each gate.

* * * * *